(12) United States Patent
Yamamoto et al.

(10) Patent No.: US 12,463,060 B2
(45) Date of Patent: Nov. 4, 2025

(54) CONTROL DEVICE, SUBSTRATE PROCESSING SYSTEM, AND METHOD OF CONTROLLING VACUUM VALVE DEVICE

(71) Applicant: TOKYO ELECTRON LIMITED, Tokyo (JP)

(72) Inventors: Takuya Yamamoto, Yamanashi (JP); Takashi Sugimoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 201 days.

(21) Appl. No.: 18/350,420

(22) Filed: Jul. 11, 2023

(65) Prior Publication Data
US 2024/0030046 A1 Jan. 25, 2024

(30) Foreign Application Priority Data
Jul. 22, 2022 (JP) .................. 2022-117477

(51) Int. Cl.
*H01L 21/67* (2006.01)
*F16K 31/04* (2006.01)
*F16K 51/02* (2006.01)
*H01J 37/32* (2006.01)
*H02P 8/18* (2006.01)

(52) U.S. Cl.
CPC ...... *H01L 21/67017* (2013.01); *F16K 31/047* (2013.01); *F16K 51/02* (2013.01); *H01J 37/32816* (2013.01); *H01L 21/67196* (2013.01); *H01L 21/67201* (2013.01); *H02P 8/18* (2013.01); *H01J 2237/184* (2013.01)

(58) Field of Classification Search
CPC ....... H01L 21/67167; H01L 21/677451; H01L 21/67242; H01L 21/67739; G05B 19/4065; F15B 11/0413; F15B 13/027; F15B 15/22; F15B 11/068; F16K 3/32; F16K 51/02
See application file for complete search history.

(56) References Cited

U.S. PATENT DOCUMENTS

| 9,520,309 B2 | 12/2016 | Hiroki |
| 2002/0000677 A1 | 1/2002 | Tahara et al. |
| 2014/0271051 A1 | 9/2014 | Hiroki |

FOREIGN PATENT DOCUMENTS

| JP | 2002-025877 A | 1/2002 |
| JP | 2004327788 A | * 11/2004 |
| JP | 2014-179508 A | 9/2014 |
| KR | 10-2009-0047349 A | 5/2009 |

* cited by examiner

*Primary Examiner* — Said Bouziane
(74) *Attorney, Agent, or Firm* — Fenwick & West LLP

(57) ABSTRACT

There is a control device for controlling a vacuum valve device which includes a valve body configured to open and close a transfer path through which a first chamber and a second chamber communicate with each other, a seal member provided in the valve body, and a valve body driver having a motor and configured to drive the valve body, wherein the control device is configured to be switchable between a first operation pattern for controlling the motor at a first separation speed and a second operation pattern for controlling the motor at a second separation speed lower than the first separation speed.

13 Claims, 7 Drawing Sheets

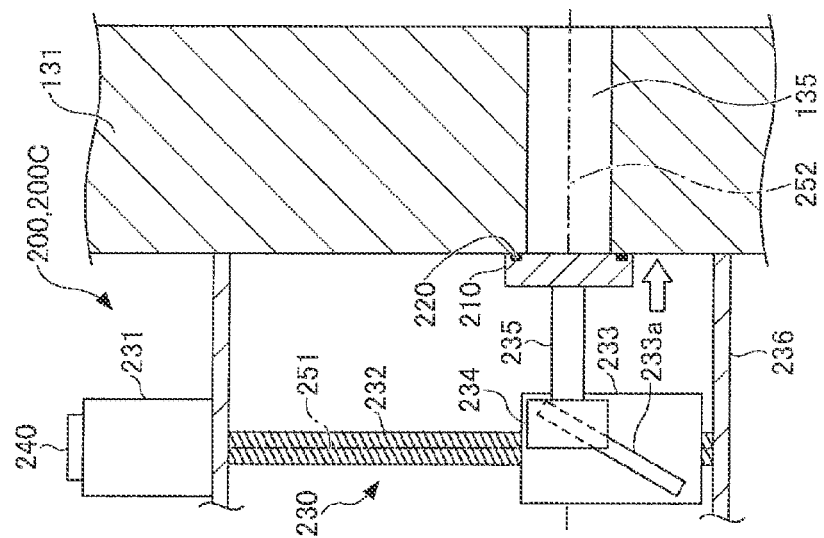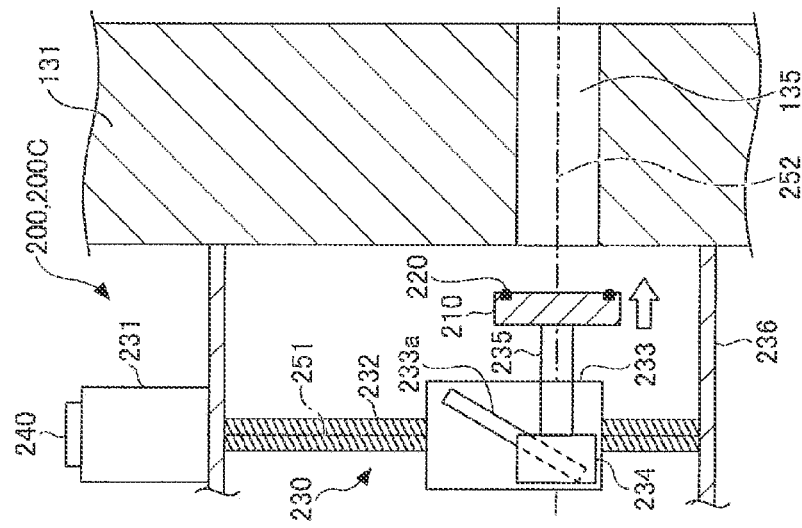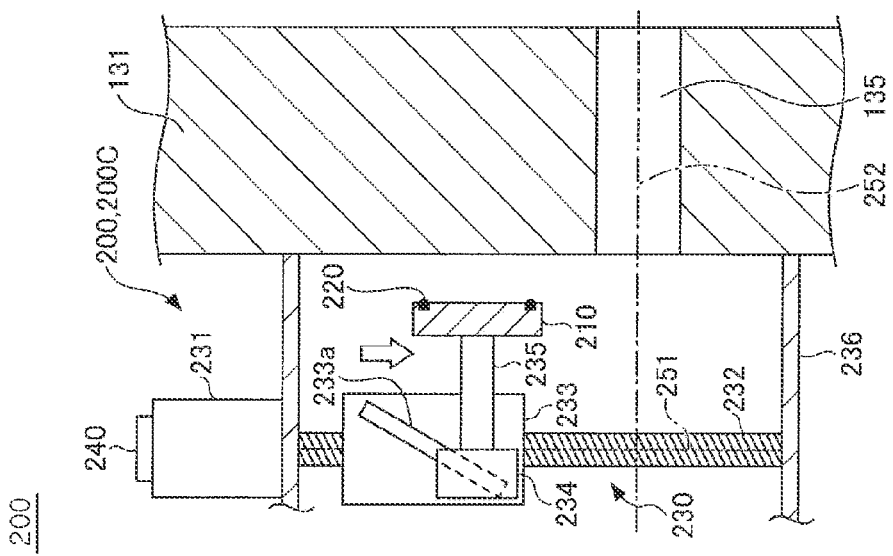

CONTROL DEVICE, SUBSTRATE PROCESSING SYSTEM, AND METHOD OF CONTROLLING VACUUM VALVE DEVICE

CROSS-REFERENCE TO RELATED APPLICATIONS

This application claims priority to Japanese Patent Application No. 2022-117477, filed on Jul. 22, 2022, the entire contents of which are incorporated herein by reference.

TECHNICAL FIELD

The present disclosure relates to a control device, a substrate processing system, and a method of controlling a vacuum valve device.

BACKGROUND

Japanese Laid-open Patent Publication No. 2014-179508 discloses a substrate processing apparatus in which a controller that is a control device controls to drive motors that respectively operate a gate valve, a lift pin, and a transfer device when the transfer device carries wafers in and out of a process module, thereby improving throughput.

Japanese Laid-open Patent Publication No. 2002-25877 discloses a parts maintenance device for semiconductor processing equipment which compares a set allowable limit value of a normal operating time of a gate valve with a measured actual operating time of the gate valve and performs maintenance determination.

SUMMARY

In one aspect, the present disclosure provides a control device, a substrate processing system, and a method of controlling a vacuum valve device, for reducing occurrence of an operational abnormality during an opening operation of the vacuum valve device.

In accordance with an aspect of the present disclosure, there is a control device for controlling a vacuum valve device which includes a valve body configured to open and close a transfer path through which a first chamber and a second chamber communicate with each other, a seal member provided in the valve body, and a valve body driver having a motor and configured to drive the valve body, wherein the control device is configured to be switchable between a first operation pattern for controlling the motor at a first separation speed and a second operation pattern for controlling the motor at a second separation speed lower than the first separation speed.

BRIEF DESCRIPTION OF THE DRAWINGS

FIGS. 3A to 3C are exemplary schematic cross-sectional views illustrating a closing operation of the vacuum valve device.

DETAILED DESCRIPTION

Figure 1:
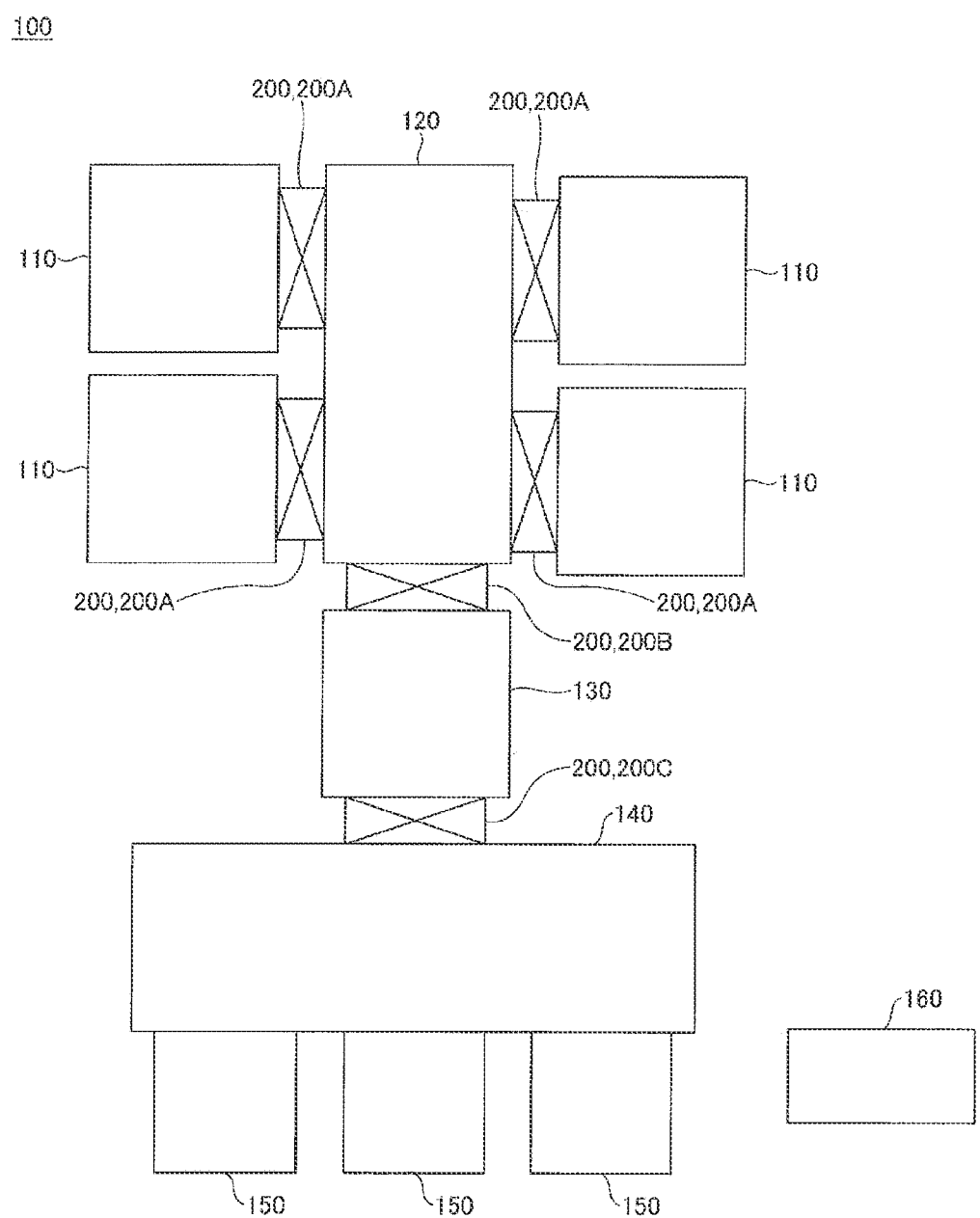
FIG. 1 is a schematic diagram showing a configuration example of a substrate processing system.

Hereinafter, embodiments for carrying out the present disclosure will be described with reference to the drawings. In each figure, the same components are denoted by the same reference numerals, and redundant description thereof may be omitted.

<Substrate Processing System 100>

An example of the overall configuration of a substrate processing system 100 according to one embodiment will be described with reference to FIG. 1. FIG. 1 is a plan view showing an example of a configuration of the substrate processing system 100 according to one embodiment.

The substrate processing system 100 shown in FIG. 1 is a cluster structure (multi-chamber type) system. The substrate processing system 100 includes a plurality of processing chambers 110, a vacuum transfer chamber 120, a load lock chamber 130, an atmospheric transfer chamber 140, load ports 150, and a control device 160. The substrate processing system 100 also includes gate valves 200A, a gate valve 200B, and a door valve 200C. In the following description, the gate valves 200A, the gate valve 200B, and the door valve 200C are also referred to as a vacuum valve device 200.

The processing chambers 110 are connected to the vacuum transfer chamber 120 via the gate valves 200A. The processing chambers 110 communicate with the vacuum transfer chamber 120 by opening and closing the gate valves 200A.

Each processing chamber 110 has a mounting part (not shown) on which a substrate is mounted. The inside of the processing chamber 110 is depressurized to a predetermined vacuum atmosphere. Desired processing (for example, etching processing, film forming processing, cleaning processing, asking processing, etc.) is performed on the substrate mounted on the mounting part inside the processing chamber 110. Further, the processing chamber 110 may be, for example, a processing chamber in which plasma is generated to perform desired processing on the substrate. Alternatively, the processing chamber 110 may be, for example, a processing chamber in which the substrate is heated to a desired temperature and desired processing is performed on the substrate.

The vacuum transfer chamber 120 is connected to a plurality of chambers (processing chambers 110 and the load lock chamber 130) via the gate valves 200A and 200B.

The inside of the vacuum transfer chamber 120 is decompressed to a predetermined vacuum atmosphere. Further, the vacuum transfer chamber 120 has a vacuum transfer device (not shown) for transferring substrates. The vacuum transfer device carries substrates in and out between the processing chambers 110 and the vacuum transfer chamber 120 according to opening and closing of the gate valves 200A. In addition, the vacuum transfer device carries substrates in and out between the load lock chamber 130 and the vacuum transfer chamber 120 according to opening and closing of the gate valve 200B. The control device 160 controls the operation of the vacuum transfer device and opening and closing of the gate valves 200A and 200B.

The load lock chamber 130 is provided between the vacuum transfer chambers 120 and the atmospheric transfer chamber 140. That is, the load lock chamber 130 is connected to the vacuum transfer chamber 120 through the gate valve 200B. Further, the load lock chamber 130 is connected to the atmosphere transfer chamber 140 through the door valve 200C.

The load lock chamber 130 has a mounting part (not shown) on which a substrate is mounted. The load lock chamber 130 is configured such that the inside thereof can be switched between an atmospheric atmosphere and a vacuum atmosphere. The load lock chamber 130 communicates with the vacuum transfer chamber 120 having a vacuum atmosphere according to opening and closing of the gate valve 200B. The load lock chamber 130 communicates with the atmosphere transfer chamber 140 having an atmospheric atmosphere according to opening and closing of the door valve 200C. Switching between the vacuum atmosphere and the atmospheric atmosphere in the load lock chamber 130 is controlled by the control device 160.

The atmospheric transfer chamber 140 has an atmospheric atmosphere inside, and for example, a down flow of clean air is formed therein. Further, the atmospheric transfer chamber 140 has an atmospheric transfer device (not shown) for conveying substrates. The atmospheric transfer device carries substrates in and out between the load lock chamber 130 and the atmospheric transfer chamber 140 according to opening and closing of the door valve 200C. Further, the operation of the atmospheric transfer device and opening and closing of the door valve 200C are controlled by the control device 160.

The load ports 150 are provided on the wall surface of the atmospheric transfer chamber 140. A carrier containing substrates or an empty carrier is set in each load port 150. As a carrier, for example, a front opening unified pod (FOUP) or the like may be used.

The atmospheric transfer device can take out substrates accommodated in the carriers set in the load ports 150 and load the same on the mounting part of the load lock chamber 130. Further, the atmospheric transfer device can take out substrates loaded on the mounting part of the load lock chamber 130 and accommodate the same in the carrier set in the load port 150.

The control device 160 includes a central processing unit (CPU), a read only memory (ROM), a random access memory (RAM), and a hard disk drive (HDD). The control device 160 may have other storage areas such as a solid state drive (SSD) in addition to the HDD. Recipes in which process order, process conditions, and transfer conditions are set are stored in storage areas such as the HDD and the RAM.

The CPU controls substrate processing in each processing chamber 110 according to a recipe to control substrate transfer. The HDD or the RAM may store a program for executing substrate processing or substrate transfer in each processing chamber 110. The program may be provided by being stored in a storage medium, or may be provided from an external device through a network.

The vacuum valve device 200 communicates between a first chamber on one side and a second chamber on the other side, and opens and closes a transfer path to be used at the time of loading and unloading substrates. The gate valve 200A opens and closes a transfer path that connects the processing chamber 110 (first chamber) and the vacuum transfer chamber 120 (second chamber). The gate valve 200B opens and closes a transfer path that connects the load lock chamber 130 (first chamber) and the vacuum transfer chamber 120 (second chamber). The door valve 200C opens and closes a transfer path that connects the load lock chamber 130 (first chamber) and the atmosphere transfer chamber 140 (second chamber).

<Vacuum Valve Device 200>

Figure 2A:
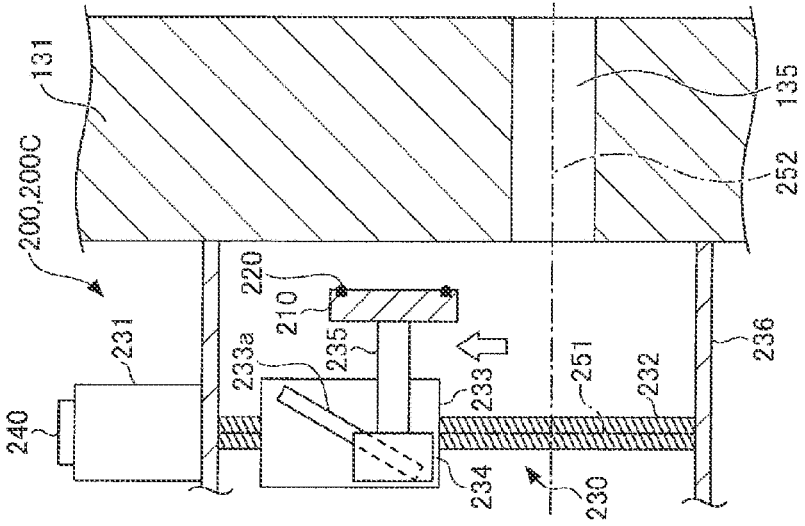
FIGS. 2A to 2C are exemplary schematic cross-sectional views illustrating an opening operation of a vacuum valve device.
Figure 2B:
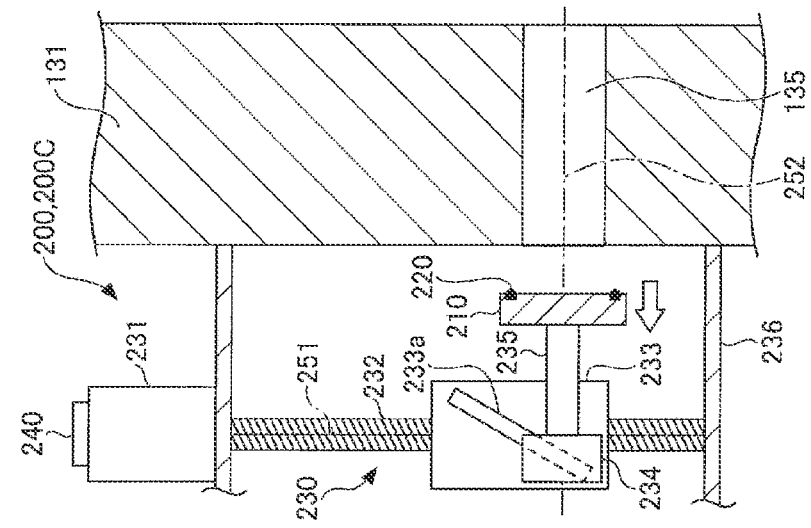
Figure 2C:
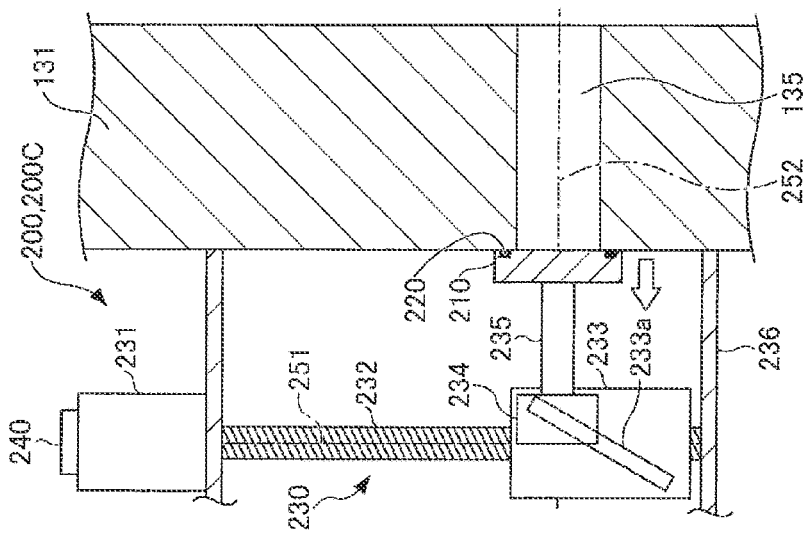

Next, the vacuum valve device 200 (gate valve 200A, gate valve 200B and door valve 200C) will be further described with reference to FIGS. 2A-2C and 3A-3C. FIGS. 2A-2C are exemplary schematic cross-sectional views illustrating an opening operation of the vacuum valve device 200. FIGS. 3A-3C are exemplary schematic cross-sectional views illustrating a closing operation of the vacuum valve device 200. In FIGS. 2A-2C and 3A-3C, an example focusing on the door valve 200C will be described.

A transfer path 135 is provided in a side wall 131 of the load lock chamber 130. The vacuum valve device 200 (door valve 200C) includes a valve body 210, a seal member 220, a valve body driver 230, and a detector 240.

The valve body 210 opens and closes the transfer path 135. The seal member 220 is provided in the valve body 210. The seal member 220 is disposed between the side wall 131 and the valve body 210 when the valve body 210 closes the transfer path 135 and hermetically seals the space between the load lock chamber 130 and the atmospheric transfer chamber 140.

The valve body driver 230 moves the valve body 210 in the direction of a shaft 251 (vertical direction) and the direction of a shaft 252 (horizontal direction). The valve body driver 230 includes a motor 231, a screw shaft 232, a base member 233, a cam member 234, a shaft member 235, and a housing 236.

The motor 231 is supported by the housing 236. A rotation shaft of the motor 231 is connected to the screw shaft 232. Accordingly, the motor 231 rotates the screw shaft 232. The motor 231 is, for example, a stepping motor. The motor 231 rotates the screw shaft 232 according to a pulse command from the control device 160 (refer to FIG. 1).

The screw shaft 232 is rotatably supported by the housing 236 with the shaft 251 as a rotation axis. The base member 233 has a screw nut (not shown) that screws onto the screw shaft 251. The screw shaft 232 and the screw nut constitute a first motion conversion mechanism that converts the rotary motion of the screw shaft 232 into the linear motion of the base member 233. The first motion conversion mechanism rotates the screw shaft 232 with the shaft 251 as a rotation axis, thereby moving (vertically moving) the base member 233 in the direction of the shaft 251.

A cam groove 233a is formed in the base member 233. The cam member 234 is formed such that it can move along the cam groove 233a. Further, the cam member 234 is configured not to move below a predetermined height position by engaging with, for example, an engaging part (not shown). The cam groove 233a, the cam member 234, and the engaging part constitute a second motion conversion mechanism that converts the linear motion of the base member 233 into the linear motion of the cam member 234. The second motion conversion mechanism moves the cam member 234 in the direction of the axis 252 by moving the base member 233 in the direction of the axis 251. That is, the second motion conversion mechanism moves the cam member 234 toward the side wall 131 by moving the base member 233 downward. Further, the second motion conversion mechanism moves the cam member 234 away from the side wall 131 by moving the base member 233 upward.

The shaft member 235 connects the cam member 234 and the valve body 210.

The detector 240 detects the actual rotation angle of the rotation shaft of the motor 231. The detector 240 is, for example, a rotary encoder. The detector 240 also detects the rotation angle of the rotation axis of the screw shaft 232. Further, the detector 240 detects the position of the base member 233 moved in the vertical direction by the first motion conversion mechanism based on the detected rotation angle of the rotation shaft of the motor 231. In addition, the detector 240 detects the position of the valve body 210 moved in the vertical direction and in the horizontal direction by the first motion conversion mechanism and the second motion conversion mechanism based on the detected rotation angle of the rotation shaft of the motor 231. A detection signal detected by the detector 240 is transmitted to the control device 160.

Next, the opening operation of the vacuum valve device 200 (door valve 200C) will be described with reference to FIGS. 2A to 2C.

The control device 160 controls the motor 231 to rotate the screw shaft 232 in one direction. As a result, as shown in FIG. 2A, the base member 233 is moved upward by the first motion conversion mechanism, and simultaneously the cam member 234 is moved away from the side wall 131 by the second motion conversion mechanism, and thus an operation of separating the valve body 210 from the side wall 131 is performed.

Furthermore, by rotating the screw shaft 232 in one direction, the base member 233 moves upward by the first motion conversion mechanism and simultaneously, the cam member 234 moves away from the side wall 131 in the horizontal direction by the second motion conversion mechanism, as shown in FIG. 2B.

Further, by rotating the screw shaft 232 in one direction, the valve element 210 vertically moves upward along with the base member 233 by the first motion conversion mechanism, as shown in FIG. 2C. As a result, the valve body 210 retreats upward from the extension of the transfer path 135, and thus the transfer path 135 is opened.

Next, the closing operation of the vacuum valve device 200 (door valve 200 C) will be described with reference to FIGS. 3A to 3C.

The control device 160 controls the motor 231 to rotate the screw shaft 232 in another direction (direction opposite to the one direction). As a result, as shown in FIG. 3A, the valve body 210 vertically moves downward along with the base member 233 by the first motion conversion mechanism.

Further, by rotating the screw shaft 232 in the other direction, the base member 233 moves downward by the first motion conversion mechanism, and simultaneously, the cam member 234 moves horizontally in a direction closer to the side wall 131 by the second motion conversion mechanism, as shown in FIG. 3B.

Further, by rotating the screw shaft 232 in one direction, the base member 233 moves downward by the first motion conversion mechanism, and simultaneously, the cam member 234 moves in the direction of the side wall 131 by the second motion conversion mechanism, and thus an operation of pressing the valve body 210 against the side wall 131 is performed, as shown in FIG. 3C. As a result, the valve body 210 closes the transfer path 135, and the seal member 220 hermetically seals the space between the load lock chamber 130 and the atmospheric transfer chamber 140.

In this way, the vacuum valve device 200 is configured to press the valve body 210 against the side wall 131 provided with the transfer path 135 or separate the valve body 210 from the side wall 131 and vertically move the valve body 210 by rotating the motor 231.

Here, the valve body 210 of the door valve 200C is strongly pressed against the side wall 131 of the load lock chamber 130 due to a pressure difference between the atmospheric transfer chamber 140 in the atmospheric atmosphere and the load lock chamber 130 in a vacuum atmosphere. When the load lock chamber 130 is idle (not in operation), the load lock chamber 130 is kept in a vacuum atmosphere and the door valve 200C is kept closed.

In addition, the gate valve 200A is disposed such that the valve body is pressed against the side wall of the processing chamber 110. Further, the inside of the processing chamber 110 is in a high temperature state when a substrate is processed by plasma processing or heat treatment. That is, the side wall of the processing chamber 110 with which the seal member comes into contact is also in a high temperature state. Further, when the processing chamber 110 is idle (not in operation), the inside of the processing chamber 110 is maintained at a high temperature, and the gate valve 200A is kept closed.

In addition, the gate valve 200B is disposed such that the valve body is pressed against the side wall of the load lock chamber 130. Even when the load lock chamber 130 is in the atmosphere, the gate valve 200B strongly presses the valve body against the side wall of the load lock chamber 130 such that the valve body 210 is not opened due to the pressure difference between the load lock chamber 130 in the atmosphere and the vacuum transfer chamber 120 in a vacuum atmosphere. Therefore, when the load-lock chamber 130 becomes a vacuum atmosphere, the valve body of the gate valve 200B is more strongly pressed against the side wall of the load lock chamber 130. When the load lock chamber 130 is idle (not in operation), the load lock chamber 130 is kept in a vacuum atmosphere and the gate valve 200B is kept closed.

As described above, the vacuum valve device 200 (the gate valves 200A and 200B and the door valve 200C) is kept closed for a long time, and thus the seal member 220 may be stuck.

If the seal member 220 is stuck, the opening operation of the vacuum valve device 200 is not completed within a predetermined time, which is determined as an operational abnormality (error) due to timeout, or the valve body 210 sticks to the side wall 131 and thus cannot be separated therefrom due to the stuck seal member 220, which is determined as an operational abnormality (error).

<First Operation Control>

Figure 4:
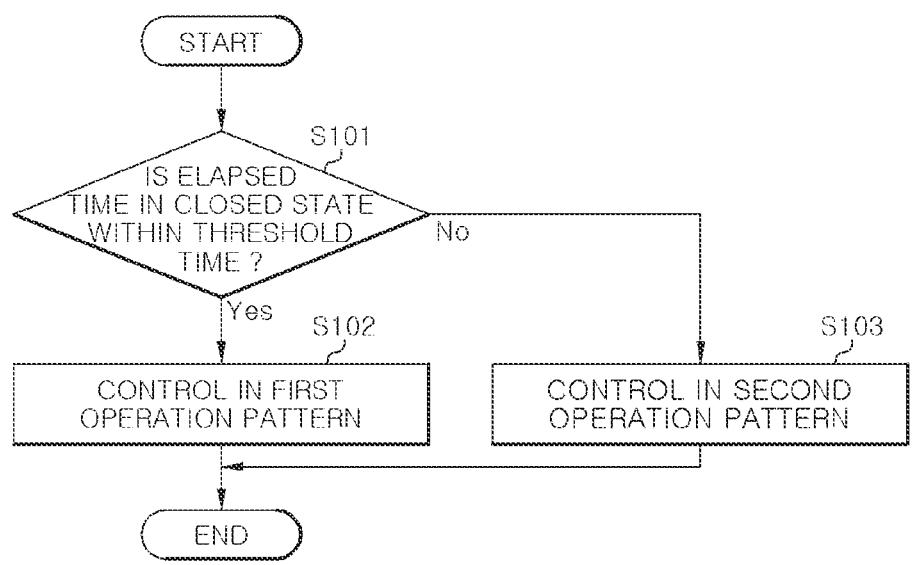
FIG. 4 is an exemplary flowchart illustrating a first operation control of the vacuum valve device.

Next, operation control of the vacuum valve device 200 by the control device 160 during the opening operation of the vacuum valve device 200 will be described with reference to FIGS. 4 and 5. FIG. 4 is an exemplary flowchart illustrating first operation control of the vacuum valve device 200.

In step S101, the control device 160 determines whether or not an elapsed time in a closed state of the vacuum valve device 200 is within a threshold time. Here, the threshold time is a time for determining whether or not there is a possibility that the seal member 220 of the vacuum valve device 200 will stick. The threshold time may be, for example, 24 hours.

If the elapsed time in the closed state of the vacuum valve device 200 is within the threshold time (YES in S101), control of the control device 160 proceeds to step S102.

In step S102, the control device 160 controls the motor 231 of the vacuum valve device 200 in a first operation pattern.

On the other hand, if the elapsed time in the closed state of the vacuum valve device 200 is not within the threshold time (NO in S101), control of the control device 160 proceeds to step S103.

In step S103, the control device 160 controls the motor 231 of the vacuum valve device 200 in a second operation pattern.

Figure 5:
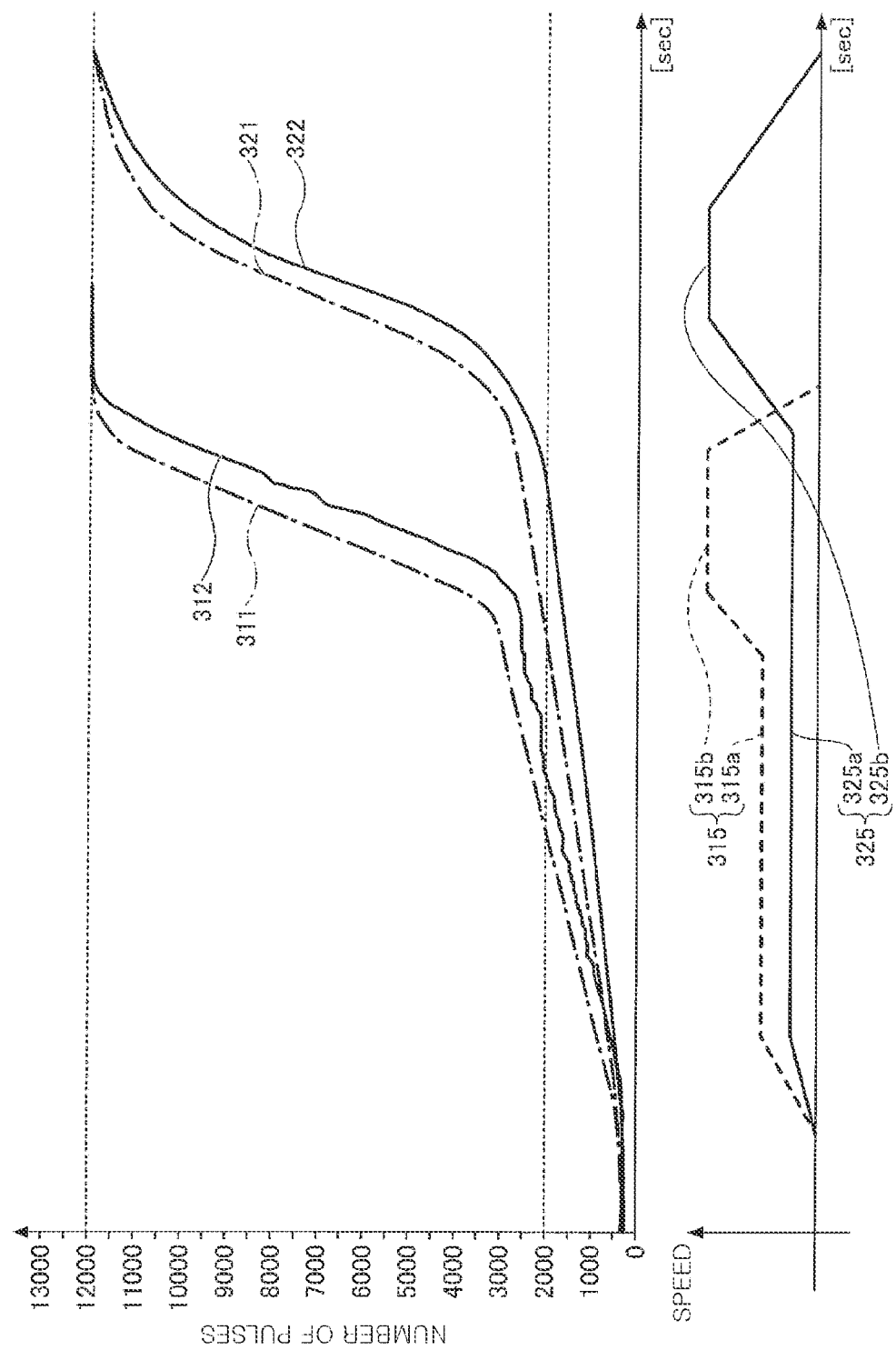
FIG. 5 shows examples of graphs showing motor pulse control and a rotational speed of a rotation shaft of a motor in the first operation control of the vacuum valve device.

FIG. 5 shows examples of graphs showing pulse control of the motor 231 and the rotation speed of the rotation shaft of the motor 231 in the first operation control of the vacuum valve device 200.

In FIG. 5, the horizontal axis of the upper graph indicates time [sec]. The vertical axis of the upper graph indicates the number of pulses of the motor 231. That is, the motor 231 is a stepping motor, and the number of pulses corresponds to the rotation amount (rotation angle) of the rotation shaft of the motor 231. In other words, the vertical axis corresponds to the amount of rotation (rotation angle) of the screw shaft 232. In other words, the vertical axis corresponds to the amount of elevation of the base member 233. In other words, the vertical axis corresponds to the position of the valve body 210. In the example of FIG. 5, the position where the separation operation is completed (refer to FIG. 2A) is 2000 [pulse]. In other words, the valve body 210 is pressed against the side wall 131 in the range of 0 to 2000 [pulse]. Further, the open position (refer to FIG. 2C) of the vacuum valve device 200 is assumed to be 12000 [pulse].

In FIG. 5, the horizontal axis of the lower graph indicates time [sec]. The vertical axis of the lower graph indicates a command value for the rotation speed of the rotation shaft of the motor 231.

In the upper graph of FIG. 5, the number of pulses (command signal position) 311 of a command signal in the first operation pattern is indicated by a dashed line. Further, the actual number of pulses (actual position) 312 in the first operation pattern is indicated by a solid line. The pulse number (command signal position) 321 of a command signal in the second operation pattern is indicated by a dashed line. Further, the actual number of pulses (actual position) 322 in the second operation pattern is indicated by a solid line. The numbers of pulses 311 and 321 of the command signal are the number of pulses commanded by the control device 160. The actual numbers of pulses 312 and 322 are calculated by the control device 160 based on a detection signal detected by the detector 240. The actual numbers of pulses 312 and 322 may be directly detected by the detector 240 and transmitted to the control device 160.

Further, in the lower graph of FIG. 5, a command speed 315 of the rotation speed of the rotation shaft of the motor 231 in the first operation pattern is indicated by a dashed line. A command speed 325 of the rotation speed of the rotation shaft of the motor 231 in the second operation pattern is indicated by a solid line.

The command speed 315 in the first operation pattern has a first separation speed 315*a* and an opening speed 315*b*. The first separation speed 315*a* is a speed during the separation operation (refer to FIG. 2A) and the horizontal operation (refer to FIG. 2B). The opening speed 315*b* is a speed during the vertical operation (refer to FIG. 2C). The first separation speed 315*a* is less than the opening speed 315*b*.

The command speed 325 in the second operation pattern has a second separation speed 325*a* and an opening speed 325*b*. The second separation speed 325*a* is a speed during the separation operation (refer to FIG. 2A) and the horizontal operation (refer to FIG. 2B). The opening speed 325*b* is a speed during the vertical operation (refer to FIG. 2C). The second separation speed 325*a* is less than the opening speed 325*b*.

Here, the second separation speed 325*a* is lower than the first separation speed 315*a*. Here, the motor 231 has a correlation that the lower the speed, the larger the torque, and the higher the speed, the smaller the torque. Accordingly, in the second operation pattern, the motor 231 is controlled at a lower speed and a higher torque than in the first operation pattern.

The duration time period of the second separation speed 325*a* in the second operation pattern is longer than the duration time period of the first separation speed 315*a* in the first operation pattern.

As described above, when the elapsed time in the closed state of the vacuum valve device 200 is equal to or longer than the threshold time (NO in S101), the control device 160 controls the motor 231 according to the second operation pattern. That is, the control device 160 controls the motor 231 at a low speed and high torque. Therefore, even if the seal member 220 is stuck, the valve body 210 can be preferably separated from the side wall 131 by increasing the torque during the separation operation (refer to FIG. 2A). In addition, it is possible to reduce the occurrence of operational abnormalities during the opening operation of the vacuum valve device 200.

When the elapsed time in the closed state of the vacuum valve device 200 is within the threshold time (YES in S101), the control device 160 controls the motor 231 according to the first operation pattern. That is, the control device 160 controls the motor 231 at a high speed and low torque. Therefore, the opening/closing time of the vacuum valve device 200 can be reduced.

In addition, in a valve body driver using an air cylinder as an actuator for driving the valve body, only instructions for opening and closing the valve body 210 can be applied. On the other hand, in the valve body driver 230 using the motor 231 as an actuator for driving the valve body 210, it is possible to reduce the occurrence of operational abnormalities (errors) by changing an opening/closing operation pattern.

<Second Operation Control>

Figure 6:
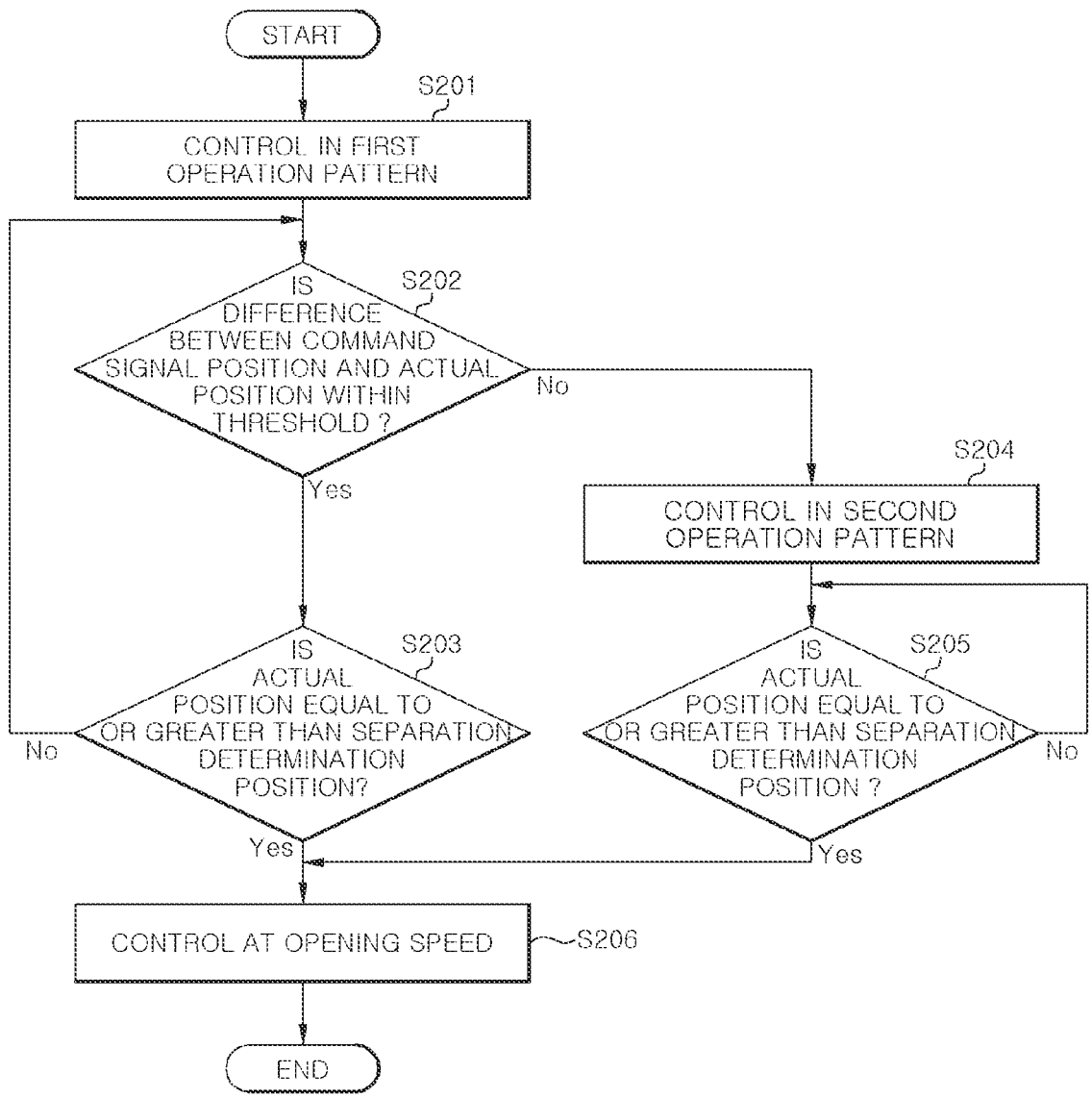
FIG. 6 is an exemplary flowchart illustrating a second operation control of the vacuum valve device.

Next, another operation control of the vacuum valve device 200 by the control device 160 during the opening operation of the vacuum valve device 200 will be described with reference to FIGS. 6 and 7. FIG. 6 is an exemplary flowchart illustrating second operation control of the vacuum valve device 200.

In step S201, the control device 160 starts control of the motor 231 in the first operation pattern.

In step S202, the control device 160 determines whether or not a difference between the number of pulses of a command signal (command signal position) and an actual number of pulses (actual position) is within a threshold. If the difference is within the threshold (YES in S202), control of the control device 160 proceeds to step S203. If the difference is not within the threshold (NO in S202), control of the control device 160 proceeds to step S204.

In step S203, the control device 160 determines whether or not the actual number of pulses (actual position) is equal to or greater than the number of separation determination pulses (separation determination position). If the actual number of pulses is not equal to or greater than the number of separation determination pulses (the separation determination position) (NO in S203), control of the control device 160 returns to step S202. If the actual number of pulses is equal to or greater than the number of separation determination pulses (separation determination position) (YES in S203), control of the control device 160 proceeds to step S206.

In step S204, the control device 160 starts control of the motor 231 in the second operation pattern.

In step S205, the control device 160 determines whether or not the actual number of pulses (actual position) is equal to or greater than the number of separation determination pulses (separation determination position). If the actual number of pulses is not equal to or greater than the number of separation determination pulses (separation determination position) (NO in S205), control of the control device 160 repeats step S205. If the actual number of pulses is equal to or greater than the number of separation determination pulses (separation determination position) (YES in S205), control of the control device 160 proceeds to step S206.

In step S206, the control device 160 controls the motor 231 at an opening speed.

Figure 7:
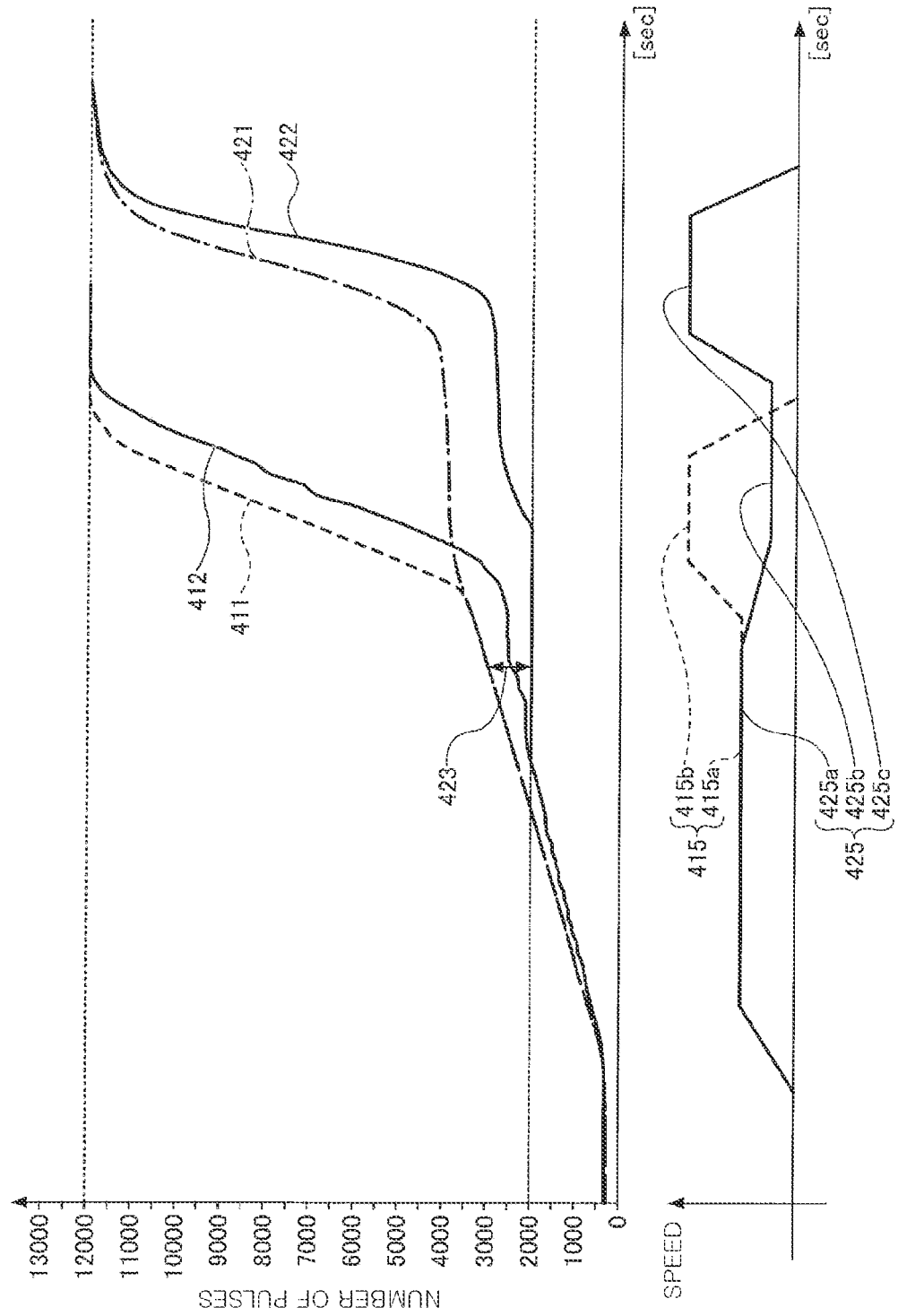
FIG. 7 shows examples of graphs showing motor pulse control and the rotation speed of the rotation shaft of the motor in the second operation control of the vacuum valve device.

FIG. 7 shows examples of graphs showing pulse control of the motor 231 and the rotation speed of the rotation shaft of the motor 231 in the second operation control of the vacuum valve device 200.

In FIG. 7, the horizontal axis of the upper graph indicates time [sec]. The vertical axis of the upper graph indicates the number of pulses of the motor 231. That is, the motor 231 is a stepping motor, and the number of pulses corresponds to the rotation amount (rotation angle) of the rotation shaft of the motor 231. In other words, the vertical axis corresponds to the amount of rotation (rotation angle) of the screw shaft 232. In other words, the vertical axis corresponds to the amount of elevation of the base member 233. In other words, the vertical axis corresponds to the position of the valve body 210. In the example of FIG. 7, the position where the separation operation is completed (refer to FIG. 2A) is 2000 [pulse]. In other words, the valve body 210 is pressed against the side wall 131 in the range of 0 to 2000 [pulse]. Further, the open position (refer to FIG. 2C) of the vacuum valve device 200 is assumed to be 12000 [pulse]. The number of separation determination pulses in steps S203 and S205 is assumed to be 2500 [pulse]. The threshold in step S202 is assumed to be 1000 [pulse].

In FIG. 7, the horizontal axis of the lower graph indicates time [sec]. The vertical axis of the lower graph indicates a command value for the rotation speed of the rotation shaft of the motor 231.

In the upper graph of FIG. 7, the number of pulses (command signal position) 411 of a command signal in the first operation pattern is indicated by a dashed line. The actual number of pulses (actual position) 412 in the first operation pattern is indicated by a solid line. The number of pulses (command signal position) 421 of a command signal in the second operation pattern is indicated by a dashed line. The actual number of pulses (actual position) 422 in the second operation pattern is indicated by a solid line. The numbers of pulses 411 and 421 of the command signal are the numbers of pulses commanded by the control device 160. The actual numbers of pulses 412 and 422 are calculated by the control device 160 based on a detection signal detected by the detector 240. The actual numbers of pulses 412 and 422 may be directly detected by the detector 240 and transmitted to the control device 160.

In the lower graph of FIG. 7, a command speed 415 of the rotation speed of the rotation shaft of the motor 231 in the first operation pattern is indicated by a dashed line. A command speed 425 of the rotation speed of the rotation shaft of the motor 231 in the second operation pattern is indicated by a solid line.

Further, the command speed 415 in the first operation pattern has a first separation speed 415a and an opening speed 415b. The first separation speed 415a is a speed during the separation operation (refer to FIG. 2A) and the horizontal operation (refer to FIG. 2B). The opening speed 415b is a speed during the vertical operation (refer to FIG. 2C). The first separation speed 415a is less than the opening speed 415b.

The command speed 425 in the second operation pattern has a first separation speed 425a, a second separation speed 425b, and an opening speed 425c. The first separation speed 425a and the second separation speed 425b are speeds during the separation operation (refer to FIG. 2A) and the horizontal operation (refer to FIG. 2B). Further, the first separation speed 425a is the same speed as the first separation speed 415a. The second separation speed 425b is lower than the first separation speed 425a (415a). The opening speed 425c is a speed during the vertical operation (refer to FIG. 2C). The second separation speed 425b is less than the opening speed 425c.

Here, the operation of the vacuum valve device 200 during normal operation will be described. The control device 160 controls the motor 231 at the first separation speed 415a. Here, the seal member 220 is not stuck, and as the number of pulses 411 of the command signal increases, the actual number of pulses 412 also increases to exceed 2000 [pulse].

Then, when the actual number of pulses 412 exceeds 2500 [pulse], which is the number of separation determination pulses (YES in S203), the control device 160 controls the motor 231 at the opening speed 415b.

As described above, the operation of the vacuum valve device 200 in a normal state is controlled by the first operation pattern.

Next, the operation of the vacuum valve device 200 when the valve body is stuck will be described. The control device 160 controls the motor 231 at the first separation speed 425a (415a). Here, in the range of 0 to 2000 [pulse] in which the valve body 210 is pressed against the side wall 131, the actual number of pulses 422 increases as the number of pulses 421 of the command signal increases. However, the actual number of pulses 422 stops at the position of 2000 [pulse] because the valve body is stuck. When the difference between the number of pulses 421 of the command signal and the actual number of pulses 422 exceeds the threshold of 1000 [pulses] (NO in S202), the control device 160 switches to the second operation pattern. That is, the control device 160 controls the motor 231 at the second separation speed 425b. That is, the motor 231 is controlled at a low speed and high torque. As a result, the stuck valve body 210 is separated from the side wall 131. As the valve body 210 is separated from the side wall 131, the actual number of pulses 422 increases again.

Then, when the actual number of pulses 422 exceeds 2500 [pulse], which is the number of separation determination pulses (YES in S205), the control device 160 controls the motor 23 at the opening speed 425c.

As described above, it is determined whether or not the valve body 210 is stuck based on the difference between the number of pulses 421 of the command signal and the actual number of pulses 422 and, if the valve body 210 is determined to be stuck, the first operation pattern is switched to the second operation pattern. Accordingly, the control device 160 controls the motor 231 at a low speed and high torque. Therefore, even if the seal member 220 is stuck, the valve body 210 can be preferably separated from the side wall 131 by increasing the torque during the separation operation (refer to FIG. 2A). In addition, it is possible to reduce the occurrence of operational abnormalities during the opening operation of the vacuum valve device 200.

In addition, when the valve body is not stuck, the control device 160 controls the motor 231 in the first operation pattern. That is, the control device 160 controls the motor 231 at a high speed and low torque. Accordingly, the opening/closing time of the vacuum valve device 200 can be reduced.

In addition, in a valve body driver using an air cylinder as an actuator for driving the valve body, only instructions for opening and closing the valve body 210 can be applied. On the other hand, in the valve body driver 230 using the motor 231 as an actuator for driving the valve body 210, it is possible to reduce the occurrence of operational abnormalities (errors) by changing the opening/closing operation pattern.

Although the substrate processing system 100 has been described above, the present disclosure is not limited to the above embodiments and the like, and various modifications and improvements are possible within the scope of the present disclosure described in the claims.

The invention claimed is:

1. A control device for controlling a vacuum valve device which includes a valve body configured to open and close a transfer path through which a first chamber and a second chamber communicate with each other, a seal member provided in the valve body, and a valve body driver having a motor and configured to drive the valve body,
   wherein the control device is configured to be switchable between a first operation pattern for controlling the motor at a first separation speed and a second operation pattern for controlling the motor at a second separation speed lower than the first separation speed.

2. The control device according to claim 1, wherein the first operation pattern and the second operation pattern are switched based on an elapsed time in a closed state of the vacuum valve device.

3. The control device according to claim 2, wherein the motor is controlled in the first operation pattern if the elapsed time is shorter than a threshold time, and the motor is controlled in the second operation pattern if the elapsed time is longer than the threshold time.

4. The control device according to claim 3, wherein a time period for controlling the motor at the second separation speed in the second operation pattern is longer than a time period for controlling the motor at the first separation speed in the first operation pattern.

5. The control device according to claim 1, wherein the vacuum valve device further includes a detector configured to detect an actual rotation angle of the motor, and
   the control device is configured to switch control of the motor from the first operation pattern to the second operation pattern if a difference between a command signal position sent to the motor by the control device and an actual position detected by the detector is equal to or greater than a threshold.

6. The control device according to claim 1, wherein the motor has a correlation in which a torque increases as a rotation speed decreases.

7. The control device according to claim 1, wherein the motor is a stepping motor.

8. A substrate processing system comprising:
   the control device according to claim 1;
   the first chamber;
   the second chamber; and
   the vacuum valve device.

9. The substrate processing system according to claim 8, wherein the first chamber is a load lock chamber, the second chamber is an atmosphere transfer chamber, and the vacuum valve device is a door valve that presses the valve body against the load lock chamber.

10. The substrate processing system according to claim 8, wherein the first chamber is a processing chamber, the second chamber is a vacuum transfer chamber, and the vacuum valve device is a gate valve that presses the valve body against the processing chamber.

11. The substrate processing system according to claim 8, wherein the first chamber is a load lock chamber, the second chamber is a vacuum transfer chamber, and the vacuum valve device is a gate valve that presses the valve body against the load lock chamber.

12. A method of controlling a vacuum valve device which includes a valve body configured to open and close a transfer path through which a first chamber and a second chamber communicate with each other, a seal member provided in the valve body, and a valve body driver having a motor and configured to drive the valve body, the method comprising:
   switching an operation pattern for the motor between a first operation pattern for controlling the motor at a first separation speed and a second operation pattern for controlling the motor at a second separation speed lower than the first separation speed, based on an elapsed time in a closed state of the vacuum valve device.

13. A method of controlling a vacuum valve device which includes a valve body configured to open and close a transfer path through which a first chamber and a second chamber communicate with each other, a seal member provided in the valve body, a valve body driver having a motor and configured to drive the valve body, and a detector configured to detect an actual rotation angle of the motor, the method comprising:
   switching an operation pattern for the motor between a first operation pattern for controlling the motor at a first separation speed and a second operation pattern for controlling the motor at a second separation speed lower than the first separation speed, based on a difference between a command signal position sent to the motor and an actual position detected by the detector,
   wherein in the second operation pattern, the motor is controlled at a higher torque than in the first operation pattern.

* * * * *